(12) United States Patent
Mulder et al.

(10) Patent No.: US 7,262,639 B2
(45) Date of Patent: Aug. 28, 2007

(54) HIGH-SPEED COMPARATOR

(75) Inventors: Jan Mulder, Houten (NL); Franciscus Maria Leonardus van der Goes, The Hague (NL); Marcel Lugthart, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/038,388

(22) Filed: Jan. 21, 2005

(65) Prior Publication Data

US 2006/0164126 A1    Jul. 27, 2006

(51) Int. Cl.
*H03K 5/22* (2006.01)
(52) U.S. Cl. ......................... 327/65; 327/55
(58) Field of Classification Search ............... 327/52, 327/55, 57, 63, 65
See application file for complete search history.

(56) References Cited

U.S. PATENT DOCUMENTS

| | | | | |
|---|---|---|---|---|
| 4,816,706 A * | 3/1989 | Dhong et al. | ................. | 327/57 |
| 5,552,728 A * | 9/1996 | Lin | ............................. | 327/57 |
| 5,699,305 A * | 12/1997 | Kawashima | ................. | 365/190 |
| 5,901,088 A * | 5/1999 | Kraus | ..................... | 365/185.21 |
| 6,215,331 B1 * | 4/2001 | Setty et al. | .................... | 327/51 |
| 6,396,733 B1 * | 5/2002 | Lu et al. | ..................... | 365/158 |
| 6,794,915 B2 * | 9/2004 | Goldgeisser et al. | ........ | 327/208 |
| 2004/0125643 A1 * | 7/2004 | Kang et al. | ................. | 365/148 |

* cited by examiner

*Primary Examiner*—Kenneth B. Wells
*Assistant Examiner*—Ryan C. Jager
(74) *Attorney, Agent, or Firm*—Sterne, Kessler, Goldstein & Fox P.L.L.C.

(57) ABSTRACT

A differential comparator with improved bit-error rate performance operating with a low supply voltage. The differential comparator includes a first pair of transistors receiving a differential input. A second pair of transistors is coupled to the first pair of transistors. A pair of resistive elements is connected between the first pair and second pair of transistors so as to increase bias currents shared by the first and second pairs of transistors. The increased bias currents reduce a time required by the differential comparator to transition from a meta-stable state to a stable state, thereby improving a bit-error rate of the differential comparator. The resistive elements can use linear resistors or transmission gates. Gates of either the first or second pair of transistors can provide an output.

16 Claims, 8 Drawing Sheets

HIGH-SPEED COMPARATOR

BACKGROUND OF THE INVENTION

1. Field of the Invention

The present invention generally relates to comparators. More specifically, the present invention improves the bit-error rate of high-speed comparators that operate at low supply voltages.

2. Related Art

A comparator is designed to compare an input signal to a known reference level. The input signal can be an input voltage or an input current. Correspondingly, the known reference level can be a known voltage reference level or a known current reference level. Typically, the comparator is designed to output a logic "1" at the end of a clock cycle, when the input signal exceeds the known reference level, and to output a logic "0" at the end of the clock cycle, when the input signal is below the known reference signal. Alternatively, the comparator can be designed to operate in a converse manner. That is, the comparator can output a logic "0" at the end of the clock cycle, when the input signal exceeds the known reference level, and to output a logic "1" at the end of a clock cycle when the input signal is below the known reference level.

Comparators are basic building blocks of an Analog-to-Digital Converter (ADC). Transistors arranged to provide positive feedback are typically used to implement the comparator. Some ADC architectures, such as flash, folding and subranging ADCs, require a large number of comparators. The large number of comparators used in these ADC architectures drives the need to make the comparators capable of operating with low power supply voltages. A low power comparator reduces overall power consumption and therefore allows an ADC architecture to incorporate more comparators into its design.

Comparators are often required to operate using small input signals. Typically, the comparator can generate an output (i.e., a logic "1" or a logic "0") more quickly when provided with a large input signal. Consequently, with a small input signal, the comparator needs more time to generate the output. A bit-error may result if the comparator does not generate the output by the end of the clock cycle. With conventional ADC architectures, clock cycles are becoming shorter and input signals are becoming smaller. Accordingly, comparators that operate at high speeds, from low supply voltages, and with low bit-error rates (BERs) are desired.

The BER of the comparator strongly depends on the bias currents of the transistors used in the comparator. The bias currents within the comparator are limited by the supply voltage of the comparator. One technique for achieving a low BER without increasing the supply voltage or extending the clock cycle of the comparator involves lowering the threshold voltage of the transistors. Fabrication of low threshold voltage transistors, however, is expensive. Further, the power consumption of an "off" transistor that has a lowered threshold voltage may become high enough to be impractical.

Another technique for achieving a low BER is to implement the comparator using thick-oxide transistors that are operated from an input/output (I/O) supply voltage. The I/O power supply is often significantly higher than the power supply provided to core transistors. Thick-oxide transistors, however, require more area within an ADC, because their minimum length is greater than that of the core transistors. Further, thick-oxide transistors have a lower transconductance for the same bias current, which has a detrimental effect on the BER of the comparator. Finally, because thick-oxide transistors are operated from the higher I/O power supply, the power consumption of the comparator will increase significantly.

SUMMARY OF THE INVENTION

Accordingly, the present invention is related to a high-speed comparator that achieves a low BER while operating from low input signals and low supply voltages that substantially obviates one or more of the disadvantages of the related art.

In one aspect, there is provided a differential comparator with improved bit-error rate performance. The differential comparator includes a first pair of transistors receiving a differential input. A second pair of transistors is coupled to the first pair of transistors. A pair of resistive elements is connected between the first pair and the second pair of transistors so as to increase bias currents shared by the first and second pairs of transistors. The increased bias currents reduce a time required by the differential comparator to transition from a meta-stable state to a stable state, thereby improving a bit-error rate of the differential comparator. The resistive elements can use linear resistors or transmission gates. Gates of either the first or second pair of transistors can provide an output.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
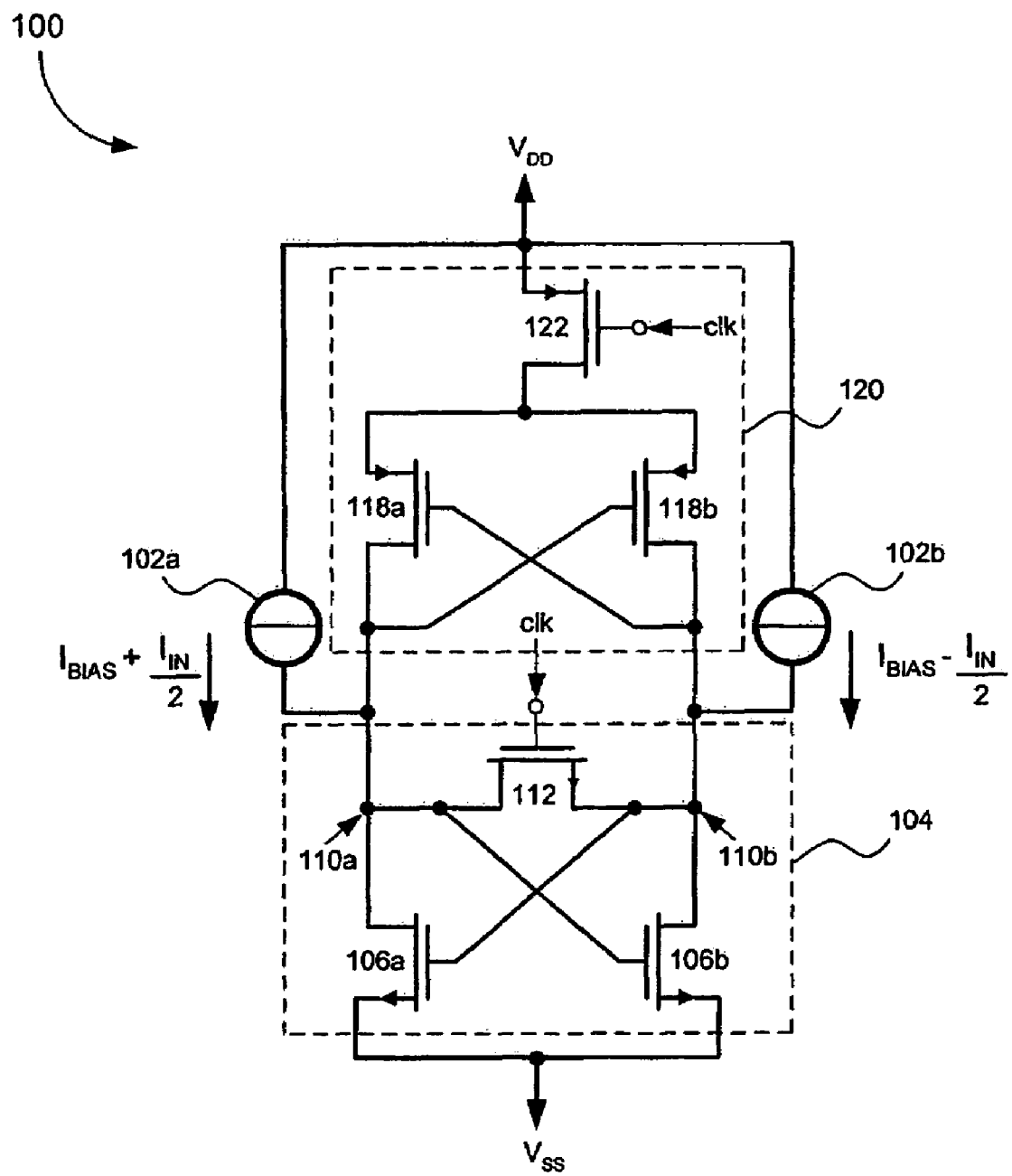
FIG. 1 illustrates an exemplary conventional differential comparator.

FIG. 1 illustrates an exemplary conventional differential comparator 100. The differential comparator 100 has an input including a differential-mode signal current $I_{IN}$ and a common-mode bias current $I_{BIAS}$. A differential input current source 102a provides an input current equal to $I_{BIAS}+I_{IN}/2$. A differential input current source 102b provides a complementary input current equal to $I_{BIAS}-I_{IN}/2$. Together, nodes 110a and 110b provide an output of the differential comparator 100.

As further shown in FIG. 1, the differential comparator 100 includes an N-channel type metal oxide semiconductor field effect transistor (NMOSFET) 106a and an NMOSFET 106b. A source of the NMOSFET 106a and a source of the NMOSFET 106b are connected to a supply voltage $V_{SS}$. The supply voltage $V_{SS}$ is a relatively low supply voltage. For example, $V_{SS}$ could be a ground or a negative supply voltage. The supply voltage $V_{SS}$ often represents a logic "0." A gate of the NMOSFET 106a is connected to a drain of the NMOSFET 106b. Similarly, a gate of the NMOSFET 106b is connected to a drain of the NMOSFET 106a. This cross-attached configuration of the NMOSFETs 106a and 106b provides positive feedback between the NMOSFETs 106a and 106b. The drain of the NMOSFET 106a is connected to a drain of an NMOSFET 112 at the node 110a. The drain of the NMOSFET 106b is connected to a source of the NMOSFET 112 at the node 110b. A gate of the NMOSFET 112 is configured to receive a clock signal (clk). The NMOSFET 112 operates as a switch responsive to the clock signal clk.

The differential comparator 100 further includes a P-channel type metal oxide semiconductor field effect transistor (PMOSFET) 118a and a PMOSFET 118b. A drain of the PMOSFET 118a is connected to a gate of the PMOSFET 118b. Similarly, a drain of the PMOSFET 118b is connected to a gate of the PMOSFET 118a. This cross-attached configuration of PMOSFETs 118a and 118b provides positive feedback between the PMOSFETs 118a and 118b. A source of the PMOSFET 118a and a source of the PMOSFET 118b are both connected to a drain of a PMOSFET 122. A source of the PMOSFET 122 is connected to a supply voltage $V_{DD}$, which is a relatively high supply voltage. However, in many applications, the voltage supply $V_{DD}$ may not exceed 1.2 volts and may be as low as 1 volt. The voltage supply $V_{DD}$ often represents a logic "1." A gate of the PMOSFET 122 is also configured to receive the clock signal clk. The PMOSFET 112 operates as a switch responsive to the clock signal clk.

Together, the NMOSFET 106a, the NMOSFET 106b and the NMOSFET 112 form an NMOS latch 104. Similarly, the PMOSFET 118a, the PMOSFET 118b and the PMOSFET 122 form a PMOS latch 120. The NMOS latch 104 and the PMOS latch 120 are arranged in a stacked configuration between the supply voltages $V_{SS}$ and $V_{DD}$. The gate of the PMOSFET 118b and the drain of the PMOSFET 118a are connected to the NMOS latch 104 at the node 110a. The gate of the PMOSFET 118a and the drain of the PMOSFET 118b are connected to the NMOS latch 104 at the node 110b. Effectively, the gates of the NMOSFET 106a and the NMOSFET 106b are cross-attached to the drains of the PMOSFET 118b and the PMOSFET 118a, respectively. Similarly, the gates of the PMOSFET 118a and the PMOSFET 118b are cross-attached to the drains of the NMOSFET 106b and the NMOSFET 106a, respectively.

Figure 2:
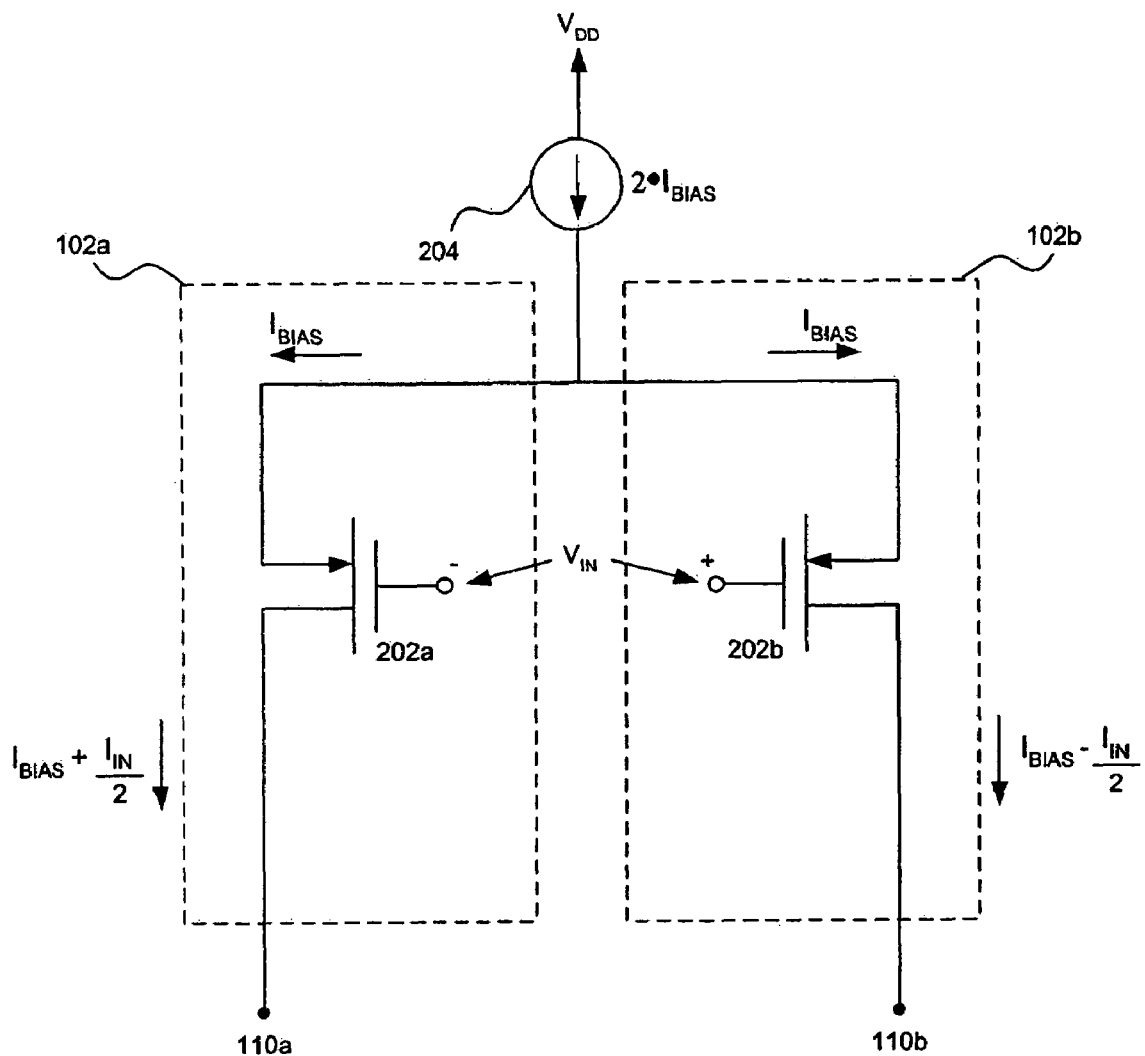
FIG. 2 illustrates a configuration of differential input current sources of the exemplary conventional differential comparator.

FIG. 2 illustrates a configuration of the differential input current sources 102a and 102b in more detail. The differential input current source 102a includes a PMOSFET 202a. The differential input current source 102b includes a PMOSFET 202b. A source of the PMOSFET 202a is connected to a source of the PMOSFET 202b. The sources of the PMOSFETs 202a and 202b are connected to a current source 204. The current source 204 supplies a bias current equal to $2 \cdot I_{BIAS}$. The current source 204 is connected to the voltage supply $V_{DD}$. The current source 204 supplies the bias current $I_{BIAS}$ to the sources of the PMOSFETs 202a and 202b. A drain of the PMOSFET 202a is connected to the node 110a. A drain of the PMOSFET 202b is connected to the node 110b.

A gate of the PMOSFET 202a and a gate of the PMOSFET 202b are connected to a differential-mode input voltage $V_{IN}$. The differential-mode input voltage $V_{IN}$ applied to the gate of the PMOSFET 202a and the gate of the PMOSFET 202b provides the differential-mode signal current $I_{IN}$ to the node 110a and the node 110b. Specifically, the differential-mode input voltage $V_{IN}$, in conjunction with the current source 204, provides the input current equal to $I_{BIAS}+I_{IN}/2$. Similarly, the differential-mode input voltage, in conjunction with the current source 204, provides the input current equal to $I_{BIAS}-I_{IN}/2$. The magnitude of the differential-mode signal current $I_{IN}$ is proportional to the magnitude of the differential-mode input voltage $V_{IN}$ applied to the gates of the PMOSFET 202a and the PMOSFET 202b.

The differential comparator 100 operates in two distinctive clock phases within one clock cycle. The first clock phase is a reset phase and the second clock phase is a latch phase. During the reset phase, the clock signal clk applied to the gate of the NMOSFET 112 and the PMOSFET 122 is relatively high. The NMOSFET 112 is turned on by the clock signal clk being relatively high. Turning on the NMOSFET 112 results in connecting the node 110a to the node 110b. In effect, the gate of the NMOSFET 106a and the gate of the NMOSFET 106b are connected together. A voltage at the node 110a is therefore equal to a voltage at the node 110b during the reset phase. This operation erases the output of the differential comparator 100 from the previous latch phase.

Also, during the reset phase, the PMOSFET 122 is turned off by the clock signal clk being relatively high. Turning the PMOSFET 112 off ensures that the PMOS latch 120 is disconnected from the voltage supply $V_{DD}$ during the reset phase. Disconnecting the PMOS latch 120 from the voltage supply $V_{DD}$ prevents excessive current flow from the voltage supply $V_{DD}$ to the voltage supply $V_{SS}$.

The latch phase of the differential comparator 100 begins when the NMOSFET 112 is turned off and the PMOSFET 122 is turned on. Specifically, the latch phase begins when the clock signal clk is relatively low. With the PMOSFET 122 turned on, the PMOS latch 120 is connected to the voltage supply $V_{DD}$. With the NMOSFET 112 turned off, the gate of the NMOSFET 106a is no longer connected to the gate of the NMOSFET 106b.

At the beginning of the latch phase, the differential comparator 100 is in a meta-stable state. The differential comparator 100 uses the positive feedback configuration of the NMOS latch 104 and the PMOS latch 120 to transition into one of two possible stable states during the latch phase. Which stable state the differential comparator 100 switches to is determined by the value of the differential-mode signal current $I_{IN}$ relative to a threshold level (i.e., the known reference level) of the differential comparator 100.

The differential comparator 100 is assumed to have an ideal threshold level of zero. When the differential-mode signal current $I_{IN}$ is greater than the threshold level, a voltage at the node 110a increases steadily. As the voltage at the node 110a increases, a drain current of the NMOSFET 106b increases and, in turn, a voltage at the node 110b decreases. As the voltage at the node 110b decreases, a drain current of the NMOSFET 106a decreases, which further increases the voltage at the node 110a. The voltage at the node 110a will continue to increase until the node 110a is pulled up to the supply voltage $V_{DD}$. The voltage at the node 110b will continue to decrease until the voltage at the node 110b is pulled down to the supply voltage $V_{SS}$. The PMOSFETs 118a and 118b serve to increase the speed at which the node 110a is pulled up to the supply voltage $V_{DD}$.

As a result of the positive feedback of the NMOS latch 104 and of the PMOS latch 120, a differential-mode signal current $I_{IN}$ greater than the threshold level causes the node 110a to "clip" to the supply voltage $V_{DD}$ and the node 110b to "clip" to the supply voltage $V_{SS}$. A logic "1" and a logic "0" are therefore output at the nodes 110a and 110b, respectively, at the end of the latch phase. This output state is one of the two stable states of the differential comparator 100.

The differential comparator 100 will transition from the meta-stable state to the alternative stable state when the differential-mode signal current $I_{IN}$ is below the threshold level. When the differential-mode signal current $I_{IN}$ is below the threshold level, a voltage at the node 110b increases steadily. As the voltage at the node 110b increases, the drain current of the NMOSFET 106a increases and, in turn, a voltage at the node 110a decreases. As the voltage at the node 110a decreases, the drain current of the NMOSFET 106b decreases, which further increases the voltage at the node 110b. The voltage at the node 110b will continue to increase until the node 110b is pulled up to the supply voltage $V_{DD}$. The voltage at the node 110a will continue to decrease until the voltage at the node 110a is pulled down to the supply voltage $V_{SS}$. The PMOSFETs 118a and 118b serve to increase the speed at which the node 110b is pulled up to the supply voltage $V_{DD}$.

As a result of the positive feedback of the NMOS latch 104 and of the PMOS latch 120, a differential-mode signal current $I_{IN}$ below the threshold level causes the node 110a to "clip" to the supply voltage $V_{SS}$ and the node 110b to "clip" to the supply voltage $V_{DD}$. A logic "0" and a logic "1" are therefore output at the nodes 110a and 110b, respectively, at the end of the latch phase. This output state is a second stable state of the differential comparator 100.

As noted above, the transition of the differential comparator 100 from a meta-stable state to one of the two stable states occurs during the latch phase. Essentially, this requires the differential comparator 100 to reach a stable state in less than one clock cycle (typically, half a clock cycle). Currently, Analog-to-Digital Converters (ADCs) are being designed to operate at clock speeds between 100 MHz and 2 GHz. At a clock speed of 1 GHz, for example, the clock period is 1 ns. Therefore, at a clock speed of 1 GHz, the differential comparator 100 has only 500 ps to transition from the meta-stable state to one of the two stable states.

The speed of the differential comparator 100 is inversely related to the value of the differential-mode signal current $I_{IN}$. That is, as $I_{IN}$ decreases, the time it takes the differential comparator 100 to complete a transition from the meta-stable state to a stable state increases. If the differential comparator 100 does not reach a stable state by the end of the latch phase, a bit-error can result. Specifically, the differential comparator does not have enough time to provide the proper output for a given differential-mode signal current $I_{IN}$. In effect, the differential comparator 100 becomes inaccurate when $I_{IN}$ becomes small. Accordingly, the bit-error rate (BER) of the differential comparator will suffer over the course of several clock cycles.

Figure 3:
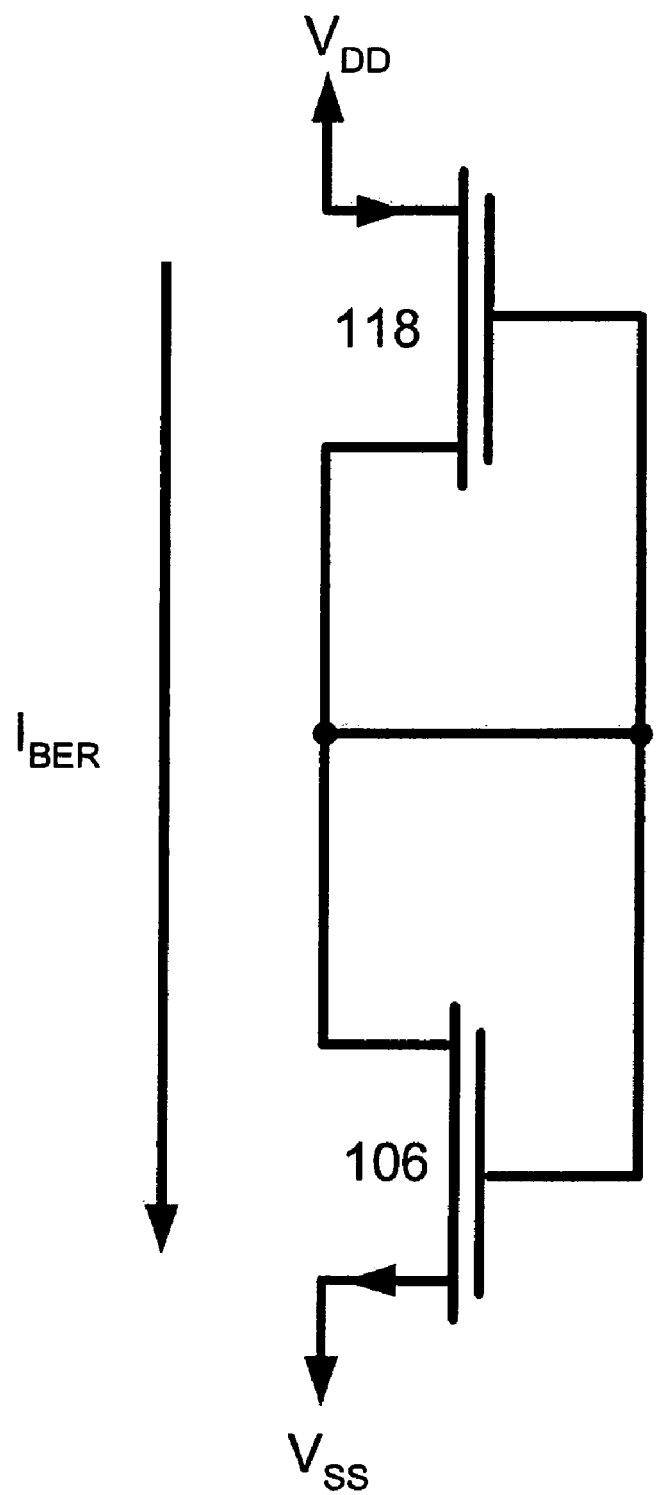
FIG. 3 illustrates a portion of the exemplary conventional differential comparator in a meta-stable state at the start of a latch phase.

The transition speed of the differential comparator 100, and consequently the BER of the differential comparator 100, is strongly dependent upon the shared drain current of the NMOSFET 106a and the PMOSFET 118a and the shared drain current of the NMOSFET 106b and the PMOSFET 118b at the start of the latch phase. When the differential comparator 100 is in the meta-stable state, a gate-source voltage of the NMOSFET 106a is equal to a gate-source voltage of the NMOSFET 106b. Similarly, a source-gate voltage of the PMOSFET 118a is equal to a source-gate voltage the PMOSFET 118b. This allows a portion of the differential comparator 100 to be represented as a half circuit. FIG. 3 illustrates a portion of the exemplary conventional differential comparator 100 in the meta-stable state, at the start of the latch phase. Specifically, the NMOSFET 106a and the NMOSFET 106b are represented by an NMOSFET 106. Similarly, the PMOSFET 118a and the PMOSFET 118b are represented by a PMOSFET 118. As shown in FIG. 3, a source of the PMOSFET 118 is connected to the supply voltage $V_{DD}$ since the PMOSFET 122 (not shown in FIG. 3) is turned on during the latch phase.

In FIG. 3, the on-resistance of the PMOSFET 122 is assumed to be negligible. Further, it is assumed that the differential-mode signal current $I_{IN}$ and the common-mode bias current $I_{BIAS}$ have been disconnected from the differential comparator 100. FIG. 3 shows a drain current, $I_{BER}$, shared by the NMOSFET 106 and the PMOSFET 118. A relationship between the drain current $I_{BER}$ and the supply voltage $V_{DD}$ can be determined from the half circuit representation of the differential comparator 100 illustrated in FIG. 3. It follows from FIG. 3 that:

$$V_{SG,118}(I_{BER}) + V_{GS,106}(I_{BER}) = V_{DD},$$

where $V_{SS} = 0$ volts, $V_{GS,106}$ represents the gate-source voltage of the NMOSFET 106 and is a function of $I_{BER}$, and $V_{SG,118}$ represents the source-gate voltage of the PMOSFET 118 and is also a function of $I_{BER}$. This equation shows that the sum of the gate-source voltages of the NMOSFET 106 and the PMOSFET 118, and therefore the drain current $I_{BER}$, is limited by the supply voltage $V_{DD}$.

The drain current $I_{BER}$ depicted in FIG. 3 can be increased by increasing the gate-source voltages of the NMOSFET 106 and the PMOSFET 118. Increasing the gate-source voltages of the NMOSFET 106 and the PMOSFET 118 typically entails increasing the supply voltage $V_{DD}$. The overall power consumption of the differential comparator 100 will increase when $V_{DD}$ is increased. Alternatively, the NMOSFET 106 and the PMOSFET 118 can be fabricated to have very low threshold voltages. If the NMOSFET 106 and the PMOSFET 118 have low threshold voltages, then a lower supply voltage $V_{DD}$ can be used generate a desired drain current $I_{BER}$. Fabrication of low threshold transistors, however, is expensive. Further, the overall power consumption of the differential comparator 100 may also increase from the use of low threshold transistors.

Figure 4:
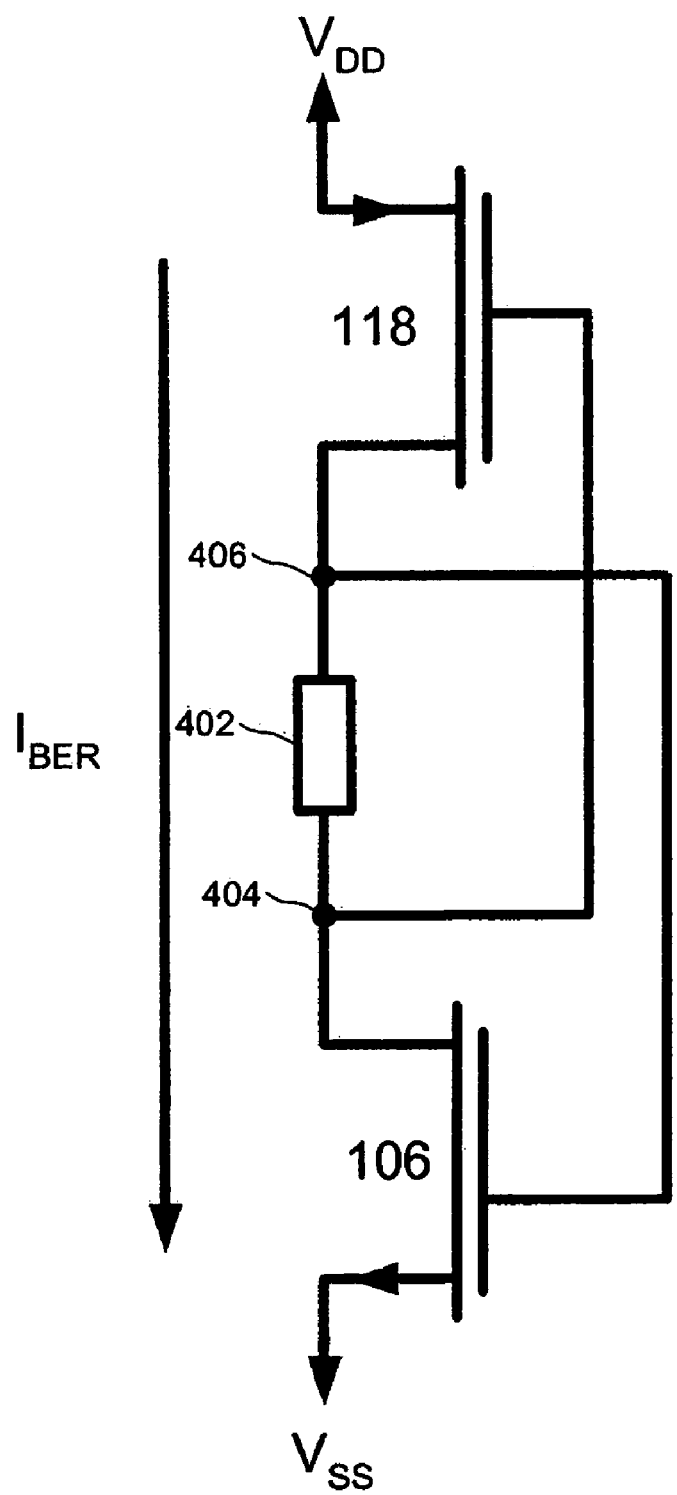
FIG. 4 illustrates a technique for increasing a drain current of the circuit of FIG. 3.

FIG. 4 shows a technique for increasing the drain current $I_{BER}$ of the NMOSFET 106 and the PMOSFET 118 without the need to increase the supply voltage $V_{DD}$ or to change the characteristics of the NMOSFET 106 or the PMOSFET 118. As shown in FIG. 4, a resistive element 402 is introduced and the connections between the NMOSFET 106 and the PMOSFET 118 are adjusted. Specifically, the resistive element 402 is placed between the drain of the NMOSFET 106, at a node 404, and the drain of the PMOSFET 118, at a node 406. Further, the gate of the NMOSFET 106 is connected to the drain of the PMOSFET 118 at the node 406 while the gate of the PMOSFET 118 is connected to the drain of the NMOSFET 106 at the node 404.

A relationship between the drain current $I_{BER}$ and the supply voltage $V_{DD}$ can be determined from the arrangement of the NMOSFET 106 and the PMOSFET 118 depicted in FIG. 4. It follows from FIG. 4 that:

$$V_{SG,118}(I_{BER}) + V_{GS,106}(I_{BER}) = V_{DD} + R \cdot I_{BER},$$

where R represents the resistance of the resistive element 402.

This equation shows that the sum of the gate-source voltages of the NMOSFET 106 and the PMOSFET 118 now exceeds the supply voltage $V_{DD}$. Therefore, the shared drain current $I_{BER}$ of the NMOSFET 106 and the PMOSFET 118 shown in FIG. 4 can be significantly greater than the shared drain current $I_{BER}$ of the NMOSFET 106 and the PMOSFET 118 shown in FIG. 3 for the same supply voltage $V_{DD}$.

Figure 5:
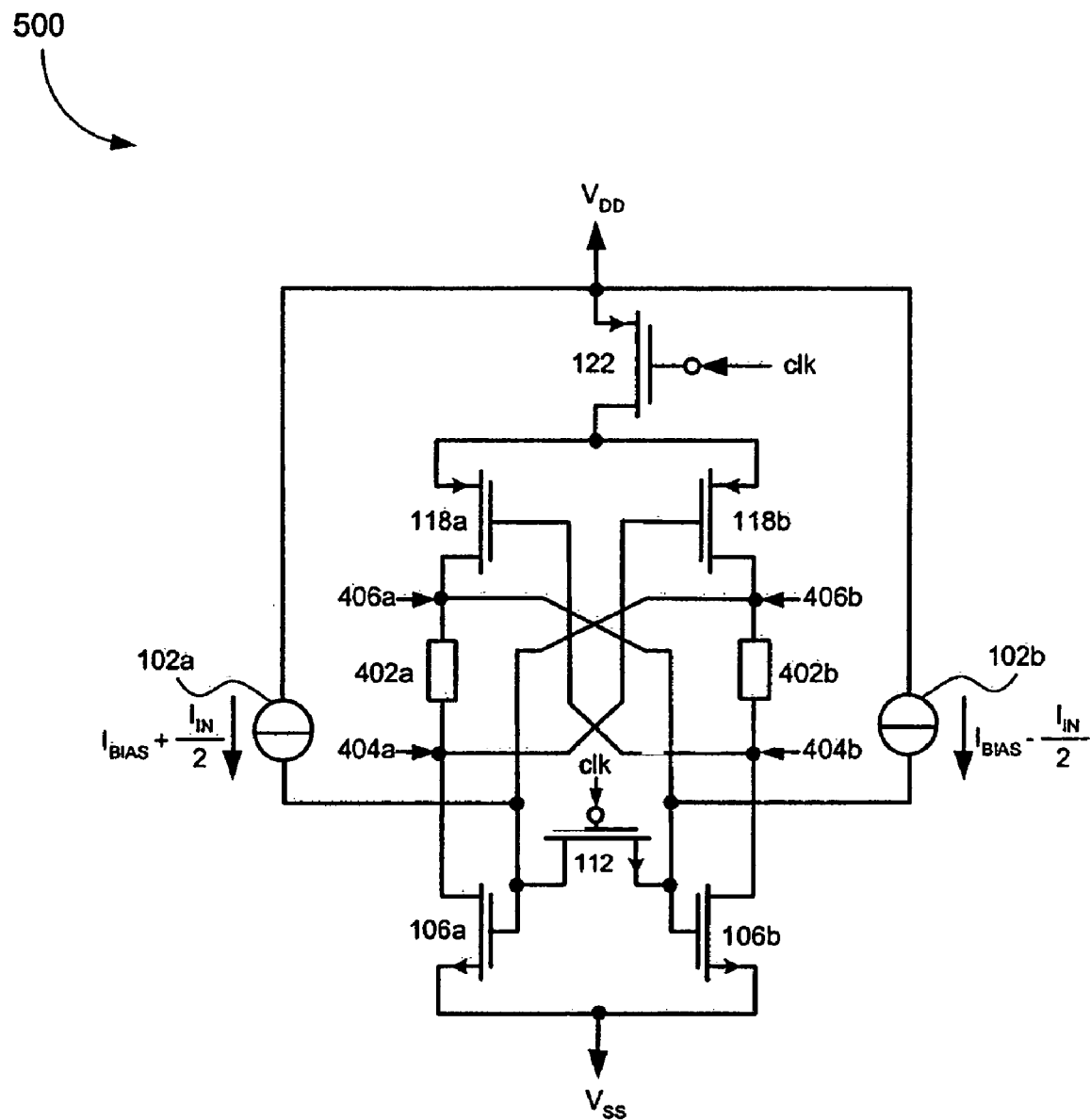
FIG. 5 illustrates a differential comparator of one embodiment of the invention with an improved bit-error rate.

FIG. 5 illustrates a differential comparator 500 incorporating the resistive element 402 in the manner shown in FIG. 4. As shown in FIG. 5, the gate of the NMOSFET 106b is connected to the drain of the PMOSFET 118a at a node 406a. The gate of the NMOSFET 106a is connected to the drain of the PMOSFET 118b at a node 406b. Similarly, the gate of the PMOSFET 118a is connected to the drain of the NMOSFET 106b at a node 404b. The gate of the PMOSFET 118b is connected to the drain of the NMOSFET 106a at a node 404a. A resistive element 402a is connected between the drain of the PMOSFET 118a and the drain of the NMOSFET 106a. Specifically, the resistive element 402a is connected between the node 404a and the node 406a. Likewise, a resistive element 402b is connected between the drain of the PMOSFET 118b and the drain of the NMOSFET 106b. Specifically, the resistive element 402b is connected between the node 404b and the node 406b. The placement of the resistive elements 402a and 402b between the connections of the NMOSFETs 106a and 106b and the PMOSFETs 118a and 118b maintains the positive feedback between the NMOSFETs 106a and 106b and the positive feedback between the PMOSFETs 118a and 118b.

An output of the differential comparator 500 is provided by nodes 406a and 406b. The differential input current source 102a is connected to the gate of the NMOSFET 106a and the differential input current source 102b is connected to the gate of the NMOSFET 106b. The threshold level of the differential comparator 500 is assumed to be zero. The differential comparator 500 depicted in FIG. 5 behaves in a similar manner to the differential comparator 100 depicted in FIG. 1. When the differential-mode signal current $I_{IN}$ is greater than the threshold level, the node 406a will "clip" to $V_{DD}$ and the node 406b will "clip" to $V_{SS}$. Alternatively, when the differential-mode signal current $I_{IN}$ is below the threshold level, the node 406a will "clip" to $V_{SS}$ and the node 406b will "clip" to $V_{DD}$.

No current flows through the resistive elements 402a and 402b after the differential comparator 500 has fully latched. A voltage at the gate of the NMOSFET 106a is therefore equal to a voltage at the gate of the PMOSFET 118a.

Likewise, a voltage at the gate of the NMOSFET 106b is equal to a voltage at the gate of the PMOSFET 118b. This allows the gates of the NMOSFETs 106a and 106b to serve as the output of the differential comparator 500 or the gates of the PMOSFETs 118a and 118b to serve as the output.

The resistive element 402a and the resistive element 402b are chosen to provide a desired drain current for the NMOSFET 106a and the PMOSFET 118a and a desired drain current for the NMOSFET 106b and the PMOSFET 118b, respectively. For example, drain currents of approximately 0.1 mA can be achieved by selecting the resistive element 402a and the resistive element 402b to each be approximately 2 kΩ, given a voltage drop of approximately 200 mV across each resistive element. By increasing the bias currents to 0.1 mA, the differential comparator 500 can maintain the same BER when the clock speed is increased by a factor of about ten. For example, the differential comparator 500 can operate at approximately 1 GHz and can achieve the same BER as the differential comparator 100 operating at only 100 MHz. Alternatively, the differential comparator 500 can be operated at the same clock speed as the differential comparator 100 while exhibiting an improved BER.

Figure 6:
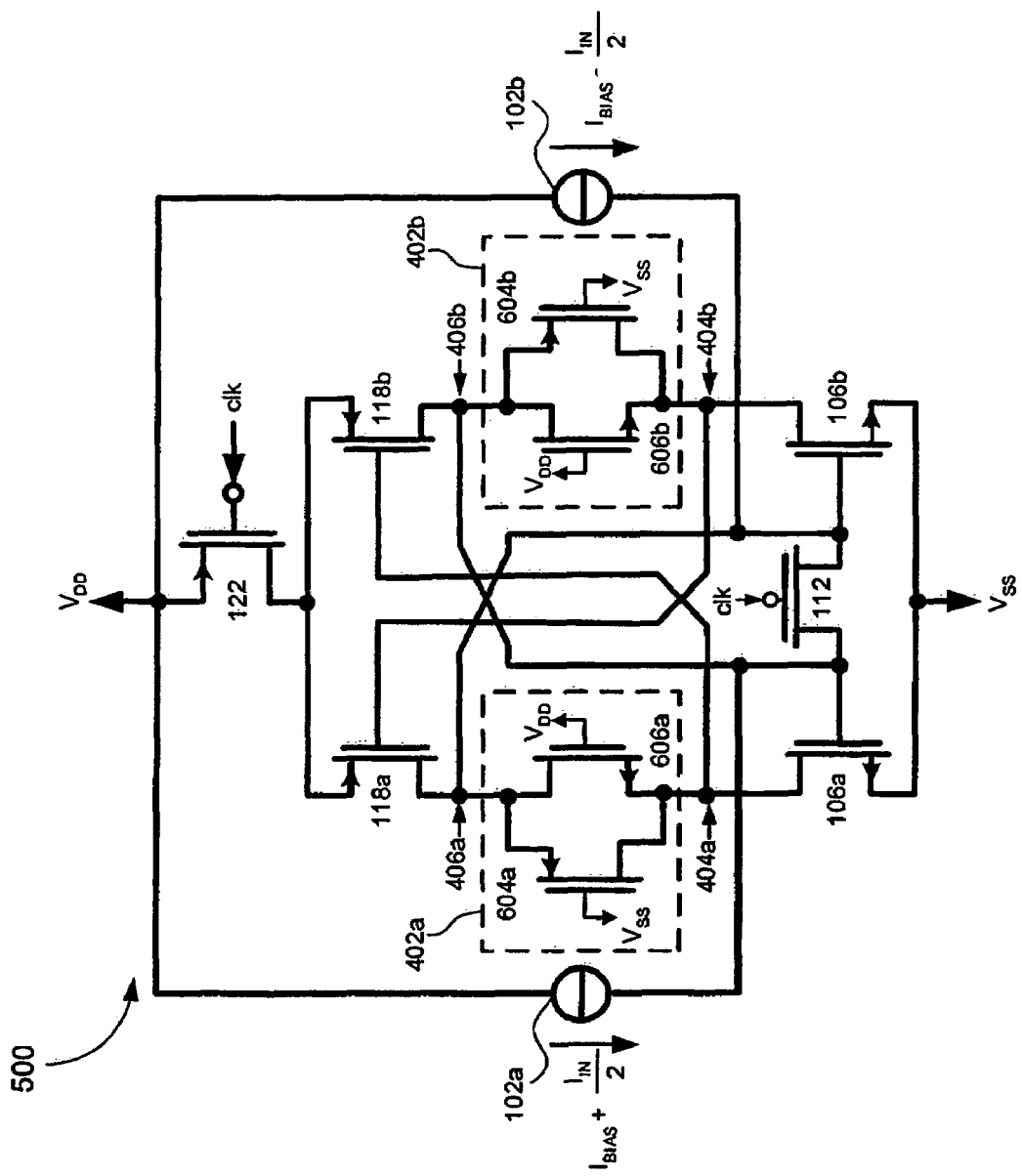
FIG. 6 illustrates another embodiment of the differential comparator of FIG. 5.

The resistive element 402a and the resistive element 402b depicted in FIG. 4 can each be implemented as a linear resistor. Alternatively, the resistive element 402a and the resistive element 402b can each be implemented, e.g., as a transmission gate. FIG. 6 illustrates the differential comparator 500 where the resistive element 402a and the resistive element 402b are each implemented as transmission gates.

The resistive element 402a includes a PMOSFET 604a and an NMOSFET 606a. A gate of the PMOSFET 604a is connected to the voltage supply $V_{SS}$. A gate of the NMOSFET 606a is connected to the voltage supply $V_{DD}$. A source of the PMOSFET 604a is connected to a drain of the NMOSFET 606a at the node 406a. A source of the NMOSFET 606a is connected to a drain of the PMOSFET 604a at the node 404a. The resistive element 402b includes a PMOSFET 604b and an NMOSFET 606b. A gate of the PMOSFET 604b is connected to the voltage supply $V_{SS}$. A gate of the NMOSFET 606b is connected to the voltage supply $V_{DD}$. A source of the PMOSFET 604b is connected to a drain of the NMOSFET 606b at the node 406b. A source of the NMOSFET 606b is connected to a drain of the PMOSFET 604b at the node 404b.

Essentially, the source and drain terminals of the PMOSFET 604a and the NMOSFET 606a are connected in parallel and the gate terminals are driven by opposite phase logic signals. With the gate of the NMOSFET 606a connected to the supply voltage $V_{DD}$, the transmission gate formed by the PMOSFET 604a and the NMOSFET 606a is in a conducting state. Specifically, the transmission gate of the PMOSFET 604a and the NMOSFET 606a are biased to be in a triode region of operation when a voltage of approximately 100 mV is applied across the node 404a and the node 406a. When the transmission gate formed by the PMOSFET 604a and the NMOSFET 606a is in the conducting state, the node 404a and the node 406a are connected together through the parallel combination of the on-resistances of the PMOSFET 604a and the NMOSFET 606a. In this way, the transmission gate formed by the PMOSFET 604a and the NMOSFET 606a provides a bidirectional resistive connection between the node 404a and the node 406a.

The transmission gate formed by the NMOSFET 606b and the PMOSFET 604b operates in a similar manner. That is, the transmission gate formed by the PMOSFET 604b and the NMOSFET 606b also provides a bidirectional resistive connection between the node 404b and the node 406b.

Figure 7:
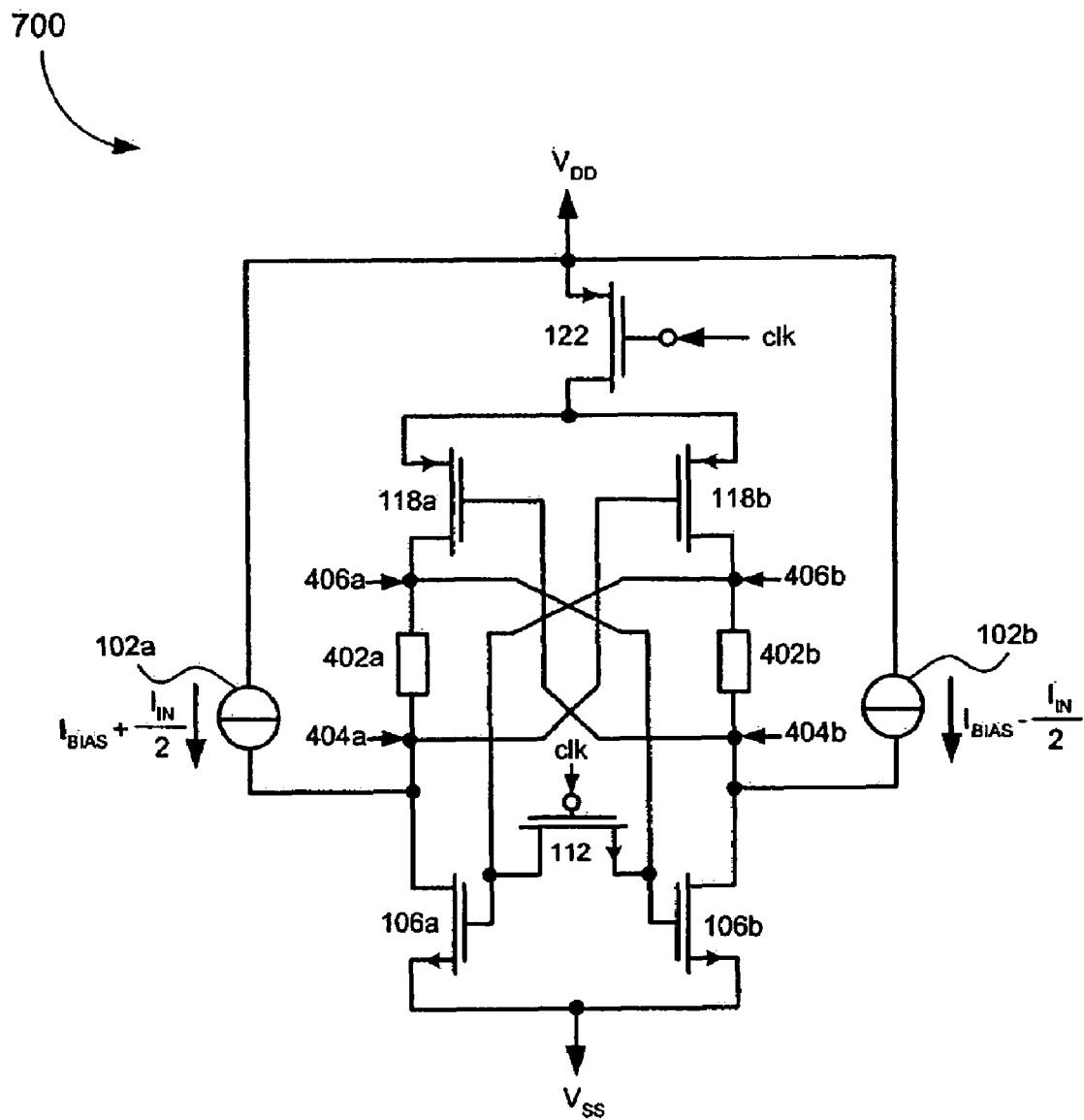
FIG. 7 illustrates an alternative arrangement of the differential comparator of FIG. 5.

FIG. 7 illustrates a differential comparator 700 that is an alternative configuration of the differential comparator 500. The arrangement of the differential comparator 700 differs from the arrangement of the differential comparator 500 in the connections of the differential input current sources 102a and 102b. Specifically, in FIG. 7, the differential input current source 102a is connected to the drain of the NMOSFET 106a and the differential input current source 102b is connected to the drain of the NMOSFET 106b. Changing the connections of the differential input current sources 102a and 102b in this way "flips" an output of the differential comparator 700 for a given input. That is, when $I_{IN}$ is greater than the threshold level, the node 406a will now "clip" to $V_{SS}$ while the node 406b will "clip" to $V_{DD}$. When $I_{IN}$ is below the threshold level, the node 406a will now "clip" to $V_{DD}$ while the node 406b will "clip" to $V_{SS}$. The inverted operation of the differential comparator 700 provides another possible implementation of the present invention.

Figure 8:
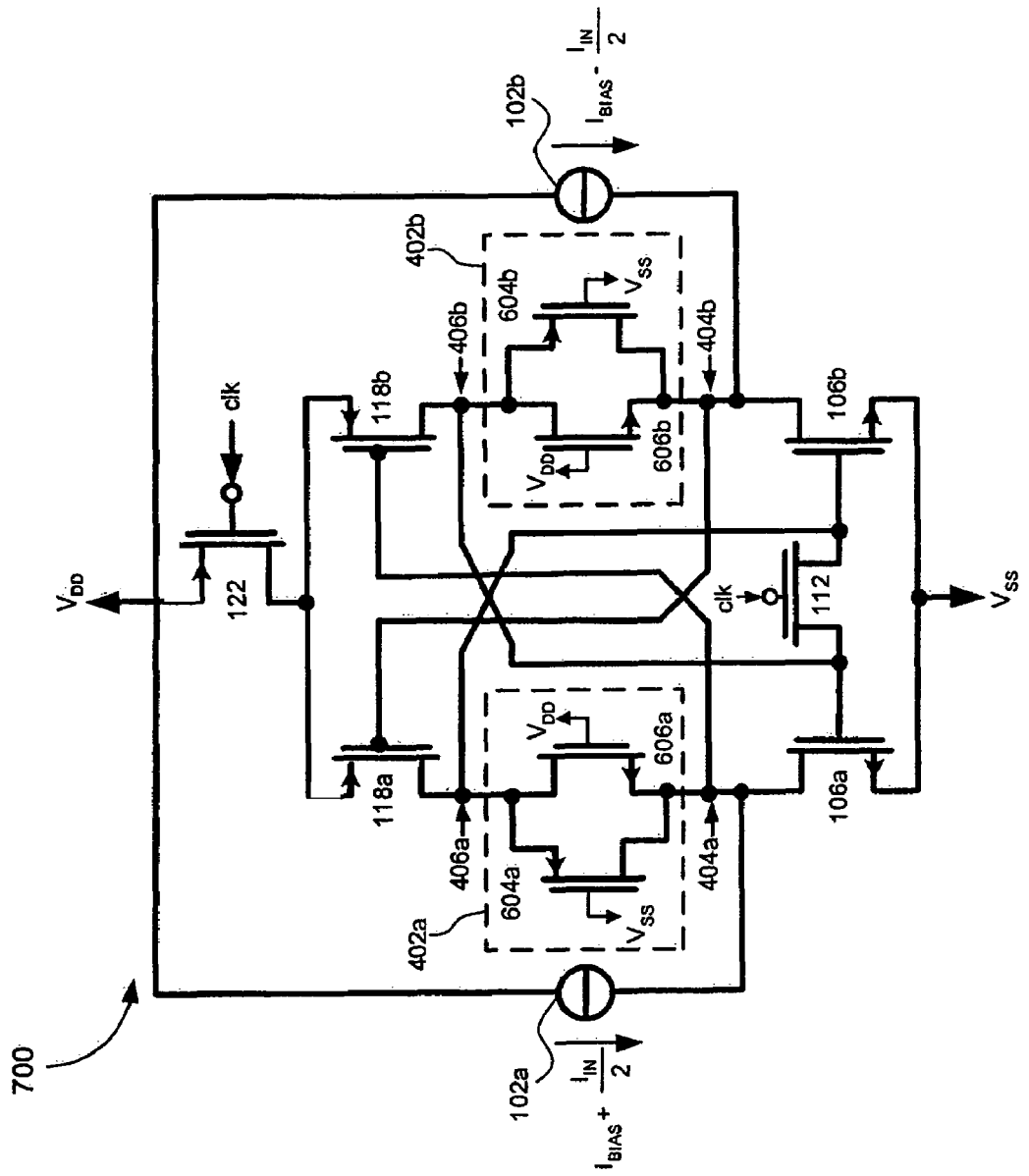
FIG. 8 illustrates another embodiment of the differential comparator of FIG. 7.

FIG. 8 illustrates the differential comparator 700 where the resistive element 402a and the resistive element 402b are each implemented as transmission gates. The differential comparator 700 depicted in FIG. 8 operates in a similar manner to the differential comparator 700 depicted in FIG. 7.

Conclusion

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A differential comparator comprising:
a first pair of transistors that receive a differential input;
a second pair of transistors coupled to the first pair of transistors;
a pair of resistive elements connected between the respective drains of the first pair of transistors and the second pair of transistors,
wherein the pair of resistive elements increases bias currents shared between the first pair of transistors and the second pair of transistors and are transmission gates,
wherein respective gates of the first pair of transistors are cross-connected to respective drains of the second pair of transistors,
wherein respective gates of the second pair of transistors are cross-connected to respective drains of the first pair of transistors.

2. The differential comparator of claim 1, wherein the first pair of transistors are N-channel type metal oxide semiconductor field effect transistors (NMOSFETs) and the second pair of transistors are P-channel type metal oxide semiconductor field effect transistors (PMOSFETs).

3. The differential comparator of claim 1, wherein:
sources of the first pair of transistors are connected to a ground; and
sources of the second pair of transistors are connected to $V_{DD}$.

4. The differential comparator of claim 3, further comprising:
a first switch that connects the gates of the first pair of transistors together during a reset phase; and
a second switch that connects the sources of the second pair of transistors to the $V_{DD}$ during a latch phase.

5. The differential comparator of claim 4, wherein the first switch is an NMOSFET and the second switch is a PMOSFET.

6. The differential comparator of claim 1, wherein gates of the first pair of transistors are connected to an output of the differential comparator.

7. The differential comparator of claim 1, wherein gates of the second pair of transistors are connected to an output of the differential comparator.

8. The differential comparator of claim 1, wherein the differential input is connected to gates of the first pair of transistors.

9. The differential comparator of claim 1, wherein the differential input is connected to drains of the first pair of transistors.

10. A differential comparator comprising:
a first transistor and a second transistor receiving a differential input and having sources connected to a ground;
a third transistor connecting gates of the first and the second transistors together during a reset phase;
a fourth transistor and a fifth transistor, wherein
sources of the fourth and fifth transistors are connected to $V_{DD}$ by a sixth transistor during a latch phase,
a drain and a gate of the fourth transistor are connected to a gate and a drain of the second transistor, respectively, and
a drain and a gate of the fifth transistor are connected to a gate and a drain of the first transistor, respectively;
a first resistive element connected between the drains of the first and the fourth transistors, wherein the first resistive element comprises a first transmission gate; and
a second resistive element connected between the drains of the second and the fifth transistors, wherein the second resistive element comprises a second transmission gate.

11. The differential comparator of claim 10, wherein the first, second and third transistors are NMOSFETs, and the fourth, fifth and sixth transistors are PMOSFETs.

12. The differential comparator of claim 10 wherein:
the first transmission gate comprises a seventh transistor and an eighth transistor, wherein
a gate of the seventh transistor is connected to the ground,
a gate of the eighth transistor is connected to $V_{DD}$, and
a drain and a source of the seventh transistor are connected to a source and a drain of the eighth transistor, respectively; and
the second transmission gate comprises a ninth transistor and a tenth transistor, wherein
a gate of the ninth transistor is connected to the ground,
a gate of the tenth transistor is connected to $V_{DD}$, and
a drain and a source of the ninth transistor are connected to a source and a drain of the tenth transistor, respectively.

13. The differential comparator of claim 12, wherein the seventh and the ninth transistors are PMOSFETs, and the eighth and the tenth transistors are NMOSFETs.

14. The differential comparator of claim 10, wherein the differential comparator transitions from a meta-stable state to a stable state during a latch phase, thereby generating an output.

15. The differential comparator of claim 10, wherein:
the first resistive element increases a first drain current shared by the first and the fourth transistors; and
the second resistive element increases a second drain current shared by the second and the fifth transistors.

16. The differential comparator of claim 10, wherein $V_{DD}$ is no more than 1 volt.

* * * * *

UNITED STATES PATENT AND TRADEMARK OFFICE
CERTIFICATE OF CORRECTION

PATENT NO.        : 7,262,639 B2                                    Page 1 of 1
APPLICATION NO.   : 11/038388
DATED             : August 28, 2007
INVENTOR(S)       : Jan Mulder It is certified that error appears in the above-identified patent and that said Letters Patent is hereby corrected as shown below:

Title Page
Item [75], Inventors section, please replace "The Hague" with --Den Haag--.

Signed and Sealed this

Thirty-first Day of March, 2009

JOHN DOLL
*Acting Director of the United States Patent and Trademark Office*